(12) United States Patent
Hasegawa

(10) Patent No.: US 6,420,914 B1
(45) Date of Patent: Jul. 16, 2002

(54) CHARGE PUMP CIRCUIT HAVING SWITCHING CIRCUITS FOR REDUCING LEAKAGE CURRENTS

(75) Inventor: Atsushi Hasegawa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/524,652

(22) Filed: Mar. 13, 2000

(30) Foreign Application Priority Data

Mar. 15, 1999 (JP) .......................................... 11-068881

(51) Int. Cl.[7] ........................ H03K 19/0185; H03L 7/06
(52) U.S. Cl. ........................ 327/112; 327/157; 326/83; 375/374; 330/262
(58) Field of Search ................................. 327/157, 148, 327/112, 391, 437; 331/17, 25; 326/83, 87; 375/374; 330/262

(56) References Cited

U.S. PATENT DOCUMENTS

| | | | | |
|---|---|---|---|---|
| 5,546,022 A | * | 8/1996 | D'Souza et al. .............. | 326/87 |
| 5,703,511 A | | 12/1997 | Okamoto ..................... | 327/157 |
| 5,818,287 A | * | 10/1998 | Chow .......................... | 327/157 |
| 5,825,640 A | * | 10/1998 | Quigley et al. .............. | 327/157 |
| 6,111,469 A | * | 8/2000 | Adachi ........................ | 331/17 |
| 6,124,741 A | * | 9/2000 | Arcus .......................... | 327/112 |
| 6,160,432 A | * | 12/2000 | Rhee et al. .................. | 327/157 |

* cited by examiner

*Primary Examiner*—Timothy P. Callahan
*Assistant Examiner*—Terry L. Englund
(74) *Attorney, Agent, or Firm*—Hayes Soloway P.C.

(57) ABSTRACT

To reduce leakage current from a current source transistor in a charge pump circuit of a PLL circuit, the charge pump circuit is activated according to an up signal or a down signal generated according to whether the phase of a clock output from VCO is faster or slower than that of a reference clock for generating current for charging or discharging an LPF that supplies input to VCO of the disclosed PLL circuit. The charge pump circuit is composed of a first current source transistor for generating current for charging LPF, a first switching transistor for connecting the first current source transistor to a power source according to an up signal, a second current source transistor for generating current for discharging LPF and a second switching transistor for grounding the second current source transistor according to a down signal, and bias is applied to the first and second current source transistors when the charge pump circuit is inactivated.

10 Claims, 7 Drawing Sheets

CHARGE PUMP CIRCUIT HAVING SWITCHING CIRCUITS FOR REDUCING LEAKAGE CURRENTS

BACKGROUND OF THE INVENTION

1. Field of the Invention

The present invention relates to a charge pump circuit, particularly relates to a charge pump circuit having switching circuits for reducing leakage current used for Phase-locked loop (PLL) circuit.

2. Description of the Related Art

A PLL circuit is widely used to regenerate a clock for example in a field of a communication and others.

FIG. 6 shows the general configuration of a PLL circuit using a charge pump circuit. The PLL circuit 101 shown in FIG. 6 roughly includes a phase-frequency comparator 102, an inverter 103, a charge pump circuit 104, a lowpass filter (LPF) 105, a voltage controlled oscillator (VCO) 106 and a frequency divider 107.

The PLL circuit divides the frequency of an internal clock output from VCO 106 via the frequency divider 107 and compares the phase with that of a reference clock from an external device in the phase-frequency comparator 102. When the phase of the reference clock is faster than that of the output of the frequency divider (the frequency of the internal clock is smaller than a reference value), the frequency of output from VCO is increased by applying a positive signal to VCO 106, when the phase of the reference clock is slower than that of output from the frequency divider (the frequency of the internal clock is more than the reference value), feedback operation is executed by applying a negative signal to VCO 106 so that the frequency of output from VCO is reduced and the frequency of the internal clock from VCO 106 is always synchronized with that of a reference clock.

At this time, the charge pump circuit 104 supplies charging current to LPF 105 according to an up* signal (* shows an inverted signal) acquired by inverting an up (UP) signal output from the phase-frequency comparator 102 via the inverter 103 when the phase of a reference clock is faster than that of the output of the frequency divider and when the phase of a reference clock is slower than that of the output of the frequency divider, discharge current is generated from LPF 105 via the charge pump circuit 104 according to a down signal output from the phase-frequency comparator 102. LPF 105 functions as a lowpass filter by integrating according to a time constant CR determined based upon a value R of resistance 105A and a value C of capacity 105B and stabilizes the operation of the PLL circuit 101 by smoothing the output of the charge pump circuit 104.

FIG. 7 shows an example of the configuration that a P-channel transistor 1, a P-channel transistor 2, an N-channel transistor 3 and an N-channel transistor 4 are sequentially connected in series between a power source $V_{DD}$ and a ground GND of the charge pump circuit. The source of the P-channel transistor 1 is connected to a power source $V_{DD}$ and is operated as a constant current source by applying bias voltage VBP lower than power supply voltage $V_{DD}$ to the gate. The P-channel transistor 2 is turned on when an up* (UP*) signal sent to the gate is at a low level (the potential of GND), supplies constant current from the power source $V_{DD}$ via the P-channel transistor 1 to LPF 105 and is turned off when an up* signal is at a high level (the potential of $V_{DD}$). The source of the N-channel transistor 4 is connected to GND and the transistor functions as a constant current source by applying bias voltage VBN higher than the potential of GND to the gate. The N-channel transistor 3 is turned on when a down (DN) signal sent to the gate is at a high level, constant current flows to GND from LPF 105 via the N-channel transistor 4 and the N-channel transistor 3 is turned off when a down signal is at a low level.

As described above, the charge pump circuit 104 controls the frequency of a clock output from VCO 106 by combining a constant current source and a switching circuit and supplying charging/discharge current to LPF 105 according to an up signal or a down signal.

Recently, the reduction of voltage to be applied to a CMOS transistor composing a circuit from an operating power source is desired as an integrated circuit is miniaturized. However, generally when operating power supply voltage to a CMOS transistor is reduced, the threshold voltage ($V_{th}$) lowers and hereby, leakage current increases when a CMOS transistor is turned off.

A PLL circuit shown in FIG. 6 also has a problem that when each transistor in the charge pump circuit shown in FIG. 7 is turned off, leakage current increases because of the reduction of voltage.

That is, in a phase locked state that the feedback control of a PLL circuit is constricted and no up signal and no down signal are generated by the phase-frequency comparator, the P-channel transistors 1 and 2 and the N-channel transistors 3 and 4 in the charge pump circuit are all turned off. However, in this state, as LPF 105 is charged in case leakage current flows out of the P-channel transistors 1 and 2 and the N-channel transistors 3 and 4, input potential to VCO 106 varies and the frequency of an output clock also varies in a state in which a phase is to be locked. The variation described above of the frequency changes depending upon the degree of leakage current in the P-channel transistors 1 and 2 and the N-channel transistors 3 and 4, for example the frequency of an output clock is offset or jitter occurs in the frequency of an output clock.

SUMMARY OF THE INVENTION

The present invention is made in view of the above situation and the object is to provide a PLL circuit wherein the offset of the frequency of an output clock and the occurrence of jitter in the frequency respectively caused by leakage current in a transistor composing a charge pump circuit can be prevented in the PLL circuit operated at low voltage.

To achieve the object, a first aspect of the invention relates to a charge pump circuit comprising:

a first current source transistor;

a first switching circuit electrically connecting a source electrode of said first current source transistor to a first voltage source when said first switching circuit receives a first control signal whereby said first current source transistor supplies a charge current from said first voltage source to an output terminal, and electrically connecting said source electrode of said first current source transistor to a second voltage source when said first switching circuit receives a second control signal whereby said first current source transistor is cut from said charge current;

a second current source transistor; and a second switching circuit electrically connecting a source electrode of said second current source transistor to a third voltage source when said second switching circuit receives a third control signal whereby said second current source transistor discharges a discharge current from said output terminal to said third voltage source, and electrically connecting said source electrode of said second current source transistor to a fourth voltage source when said second switching circuit receives a fourth control signal whereby said second current source transistor is cut off.

In the configuration according to the invention, as the PLL circuit provided with the charge pump circuit is activated or inactivated according to an up signal or a down signal generated when the phase of a clock output from the voltage controlled oscillator is faster or slower than the phase of a reference clock for generating current for charging or discharging the lowpass filter for controlling the frequency of a clock output from the voltage controlled oscillator according to the output of the lowpass filter. The charge pump circuit is composed of a first current source transistor for instructing the charge pump circuit to charge the lowpass filter, a first switching transistor for connecting the source of the first current source transistor to a power source according to an up signal, a second current source transistor for discharging the lowpass filter and a second switching transistor for grounding the second current source transistor according to a down signal and bias is applied to the first or second current source transistor when the charge pump circuit is not activated, leakage current from the current source transistor in the charge pump circuit can be reduced and therefore, offset and jitter can be prevented from occurring in the frequency of a clock output from the voltage controlled oscillator because of leakage current described above.

DETAILED DESCRIPTION OF THE PREFERRED EMBODIMENTS

Figure 1:
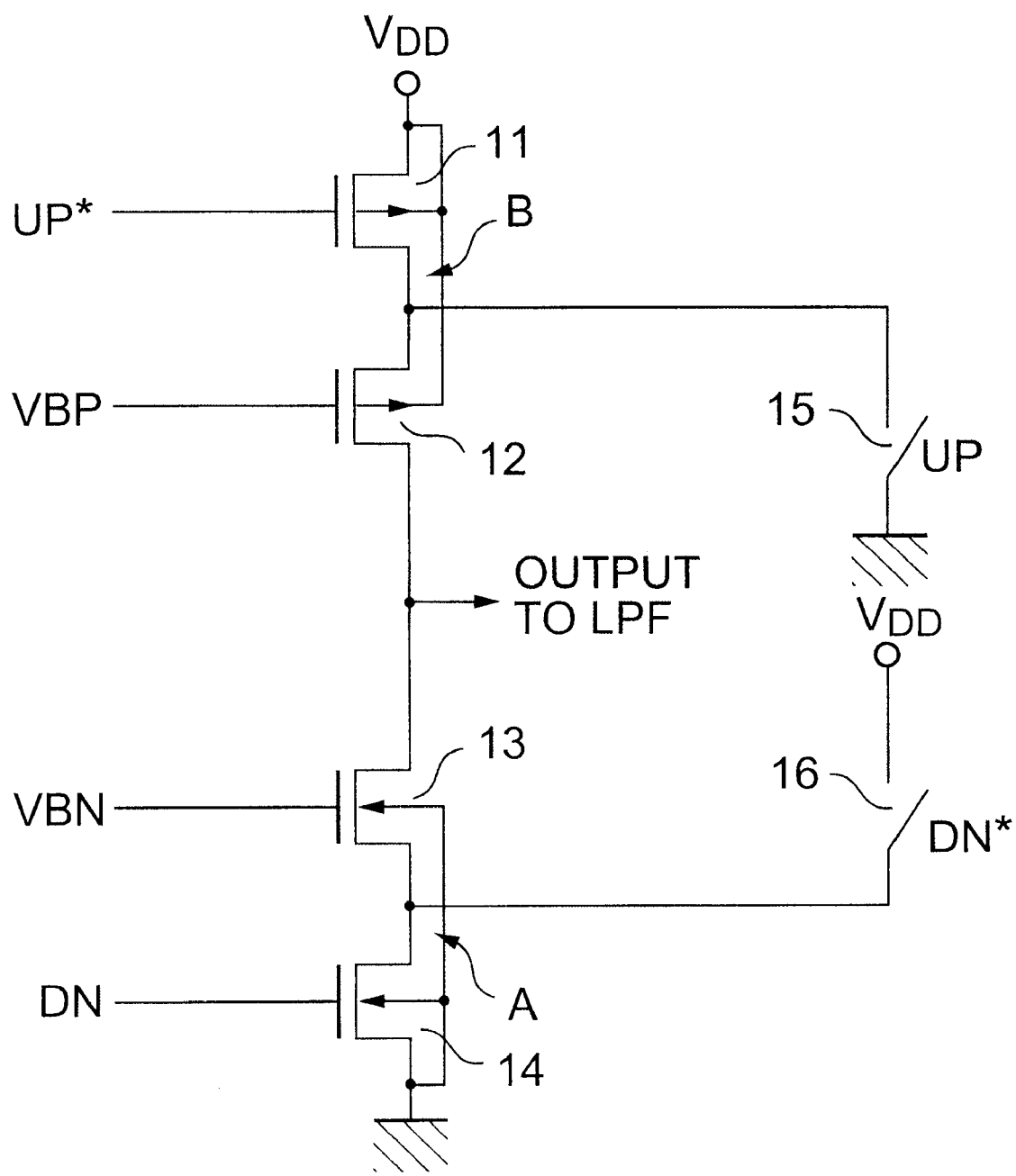
FIG. 1 is a circuit diagram showing a charge pump circuit composing a PLL circuit equivalent to a first embodiment of the invention.

Referring to the drawings, embodiments of the invention will be concretely described below.

First Embodiment

Figure 6:
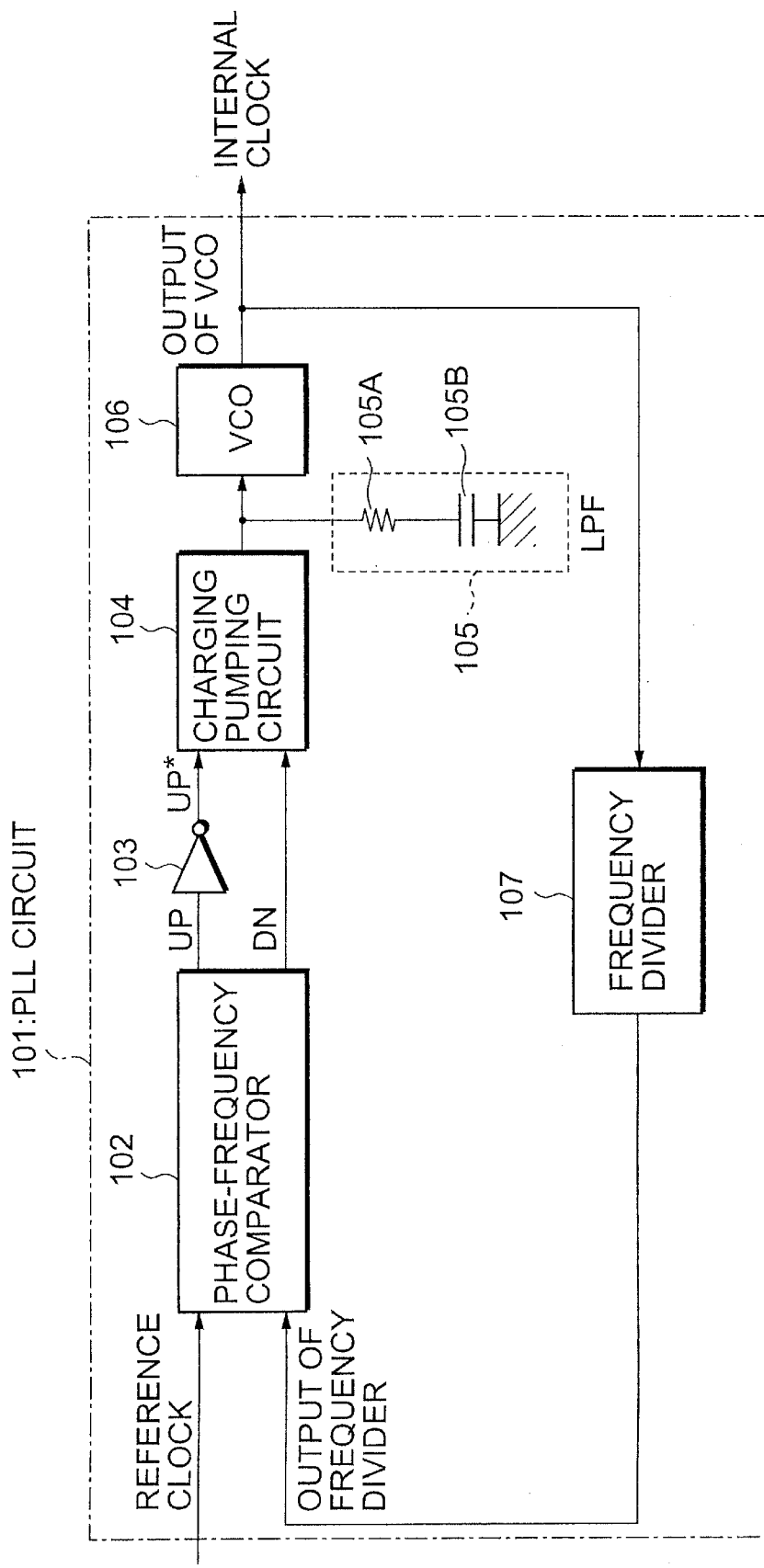
FIG. 6 is a block diagram showing the general configuration of a conventional type PLL circuit using a charge pump circuit.
Figure 7:
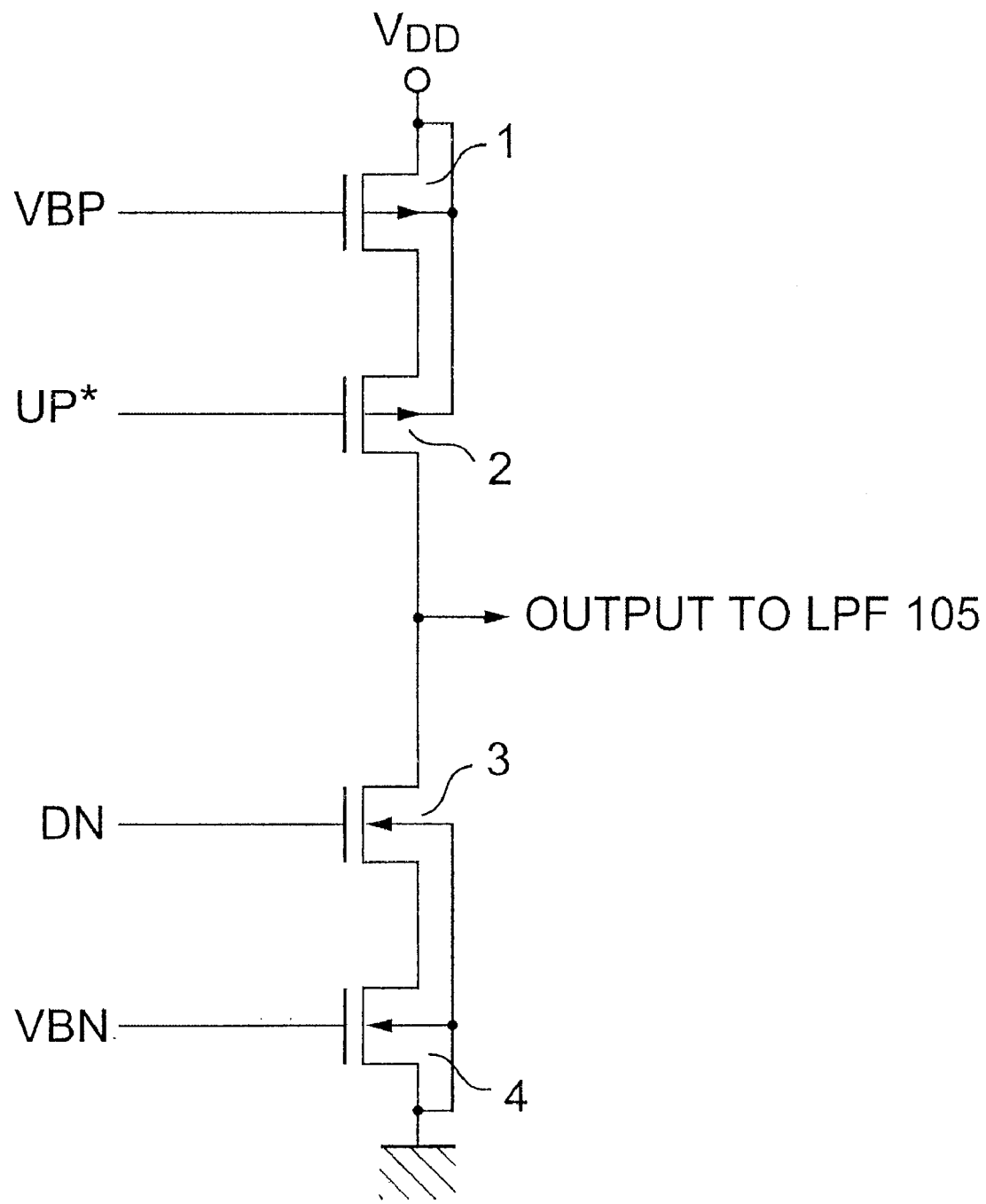
FIG. 7 shows an example of the configuration of the charge pump circuit.

FIG. 1 shows a charge pump circuit of a PLL circuit equivalent to a first embodiment of the invention. As the configuration and the operation of the PLL circuit including the charge pump circuit are similar to those of the PLL circuit shown in FIG. 6, the detailed description is omitted.

The charge pump circuit in this embodiment is composed of P-channel transistors 11 and 12, N-channel transistors 13 and 14 and switching elements 15 and 16 as shown in FIG. 1.

The P-channel transistor 11 is connected between a power source $V_{DD}$ and the P-channel transistor 12, an up* signal is supplied to the gate and the back gate is connected to the power source $V_{DD}$. The P-channel transistor 12 is connected between the P-channel transistor 11 and the N-channel transistor 13, bias voltage VBP lower than the power source $V_{DD}$ is applied to the gate and the back gate is connected to the power source $V_{DD}$. The N-channel transistor 13 is connected between the P-channel transistor 12 and the N-channel transistor 14, bias voltage VBN higher than the potential of GND is applied to the gate and the back gate is connected to GND. The N-channel transistor 14 is connected between the N-channel transistor 13 and GND, a down signal is supplied to the gate and the back gate is connected to GND. The switching element 15 is connected between the connection B of the P-channel transistors 11 and 12 and GND and is turned on when a up signal is at a low level. The switching element 16 is connected between the power source $V_{DD}$ and the connection A of the N-channel transistors 13 and 14 and is turned on when a down* (DN*) signal is at a high level.

Referring to FIG. 1, the operation of the charge pump circuit in this embodiment will be described below.

The P-channel transistor 11 is turned on when an up* signal supplied to the gate is at a low level (the potential of GND), connects the power source $V_{DD}$ to the source of the P-channel transistor 12 and is turned off when an up* signal is at a high level (the potential of $V_{DD}$). The P-channel transistor 12 functions as a constant current source by applying bias voltage VBP lower than power supply voltage $V_{DD}$ to the gate in a state in which the source is connected to the power source $V_{DD}$ and supplies constant current to LPF 105. Also, the N-channel transistor 14 is turned on when a down signal supplied to the gate is at a high level, supplies GND to the source of the N-channel transistor 13 and is turned off when a down signal is at a low level. The N-channel transistor 13 functions as a constant current source by applying bias voltage VBN higher than the potential of GND to the gate in a state in which the source is connected to GND and discharges constant current from LPF 105.

At this time, the switching element 15 is turned on when an up signal is at a low level and the potential of the connection B of the P-channel transistors 11 and 12 is divided into voltage close to the potential of GND according to the internal resistance of the switching element. Also, the switching element 16 is turned on when a down* signal is at a high level and the potential of the connection A of the N-channel transistors 13 and 14 is divided into potential close to the potential of the power source $V_{DD}$ according to the internal resistance of the switching element.

As described above, when the switching element 15 is turned on in a state in which the P-channel transistor 11 for switching is turned off, the potential of the back gate of the P-channel transistor becomes higher than that of the source when the potential of the source is close to the potential of GND because the power source $V_{DD}$ is connected to the back gate of the P-channel transistor 12 that functions as a constant current source and bias is applied to the source. Therefore, the absolute value of the threshold voltage Vth substantially becomes high because of back gate effect and leakage current is prevented. Similarly, when the switching element 16 is turned on in a state in which the N-channel transistor for switching 14 is turned off, the potential of the back gate of the N-channel transistor becomes lower than that of the source when the potential of the source is close to power supply voltage $V_{DD}$ because the back gate of the N-channel transistor 13 that functions as a constant current source is connected to GND and bias is applied to the source. Therefore, the threshold voltage Vth substantially becomes high because of back gate effect and leakage current is prevented.

As described above, in the charge pump circuit provided with a switch between the power source and the constant current source transistor for charging/discharging LPF that supplies input to VCO via the constant current source transistor when the switch is turned on of the PLL circuit equivalent to this embodiment, as leakage current is prevented by applying such voltage as produces back gate effect to the source of the constant current source transistor when the switch is turned off, the offset and the jitter of the frequency of an output clock in the PLL circuit can be reduced.

Second Embodiment

Figure 2A:
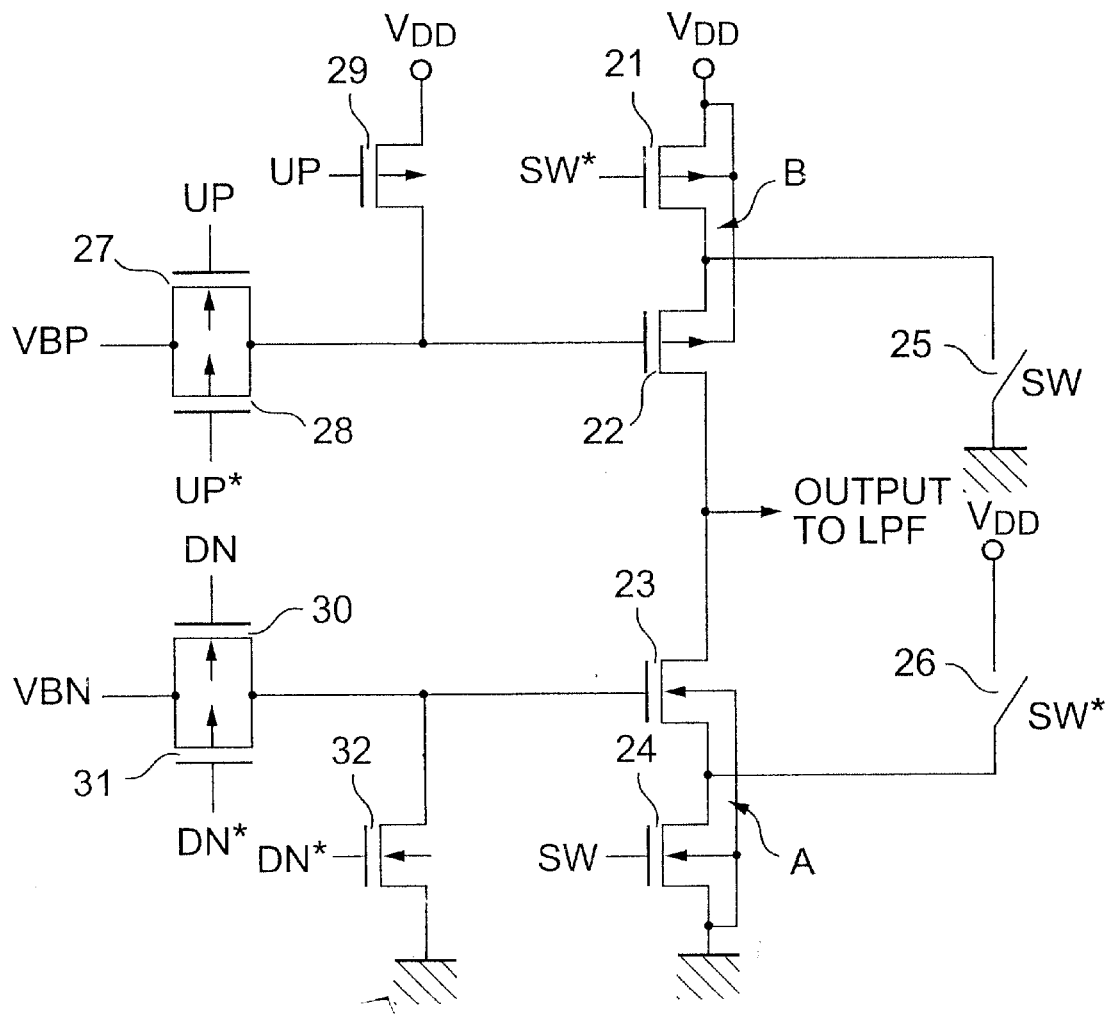
FIG. 2(a) is a circuit diagram showing a charge pump circuit composing a PLL circuit equivalent to a second embodiment of the invention.

FIG. 2(a) shows a charge pump circuit of a PLL circuit equivalent to a second embodiment of the invention.

The charge pump circuit in this embodiment is composed of P-channel transistors 21 and 22, N-channel transistors 23 and 24, switching elements 25 and 26, an N-channel transistor 27, P-channel transistors 28 and 29, an N-channel transistor 30, a P-channel transistor 31 and an N-channel transistor 32 as shown in FIG. 2(a).

The P-channel transistor 21 is connected between a power source $V_{DD}$ and the P-channel transistor 22, a switching* signal is supplied to the gate and the back gate is connected to the power source $V_{DD}$. The P-channel transistor 22 is connected between the P-channel transistor 21 and the N-channel transistor 23, and the back gate of transistor 22 is connected to the power source $V_{DD}$. A transfer switch comprising the N-channel transistor 27 and the P-channel transistor 28 and the P-channel transistor 29 is connected to the gate of transistor 22. The N-channel transistor 23 is connected between the P-channel transistor 22 and the N-channel transistor 24, and the back gate of transistor 23 is connected to GND. A transfer switch comprising the N-channel transistor 30 and the P-channel transistor 31 and the N-channel transistor 32 is connected to the gate of transistor 23. The N-channel transistor 24 is connected between the N-channel transistor 23 and GND, a switching (SW) signal is supplied to the gate, and the back gate is connected to GND.

The switching element 25 is connected between the connection B of the P-channel transistors 21 and 22 and GND and is turned on when a switching signal is at a low level. The switching element 26 is connected between the power source $V_{DD}$ and the connection A of the N-channel transistors 23 and 24 and is turned on when a switching* (SW*) signal is at a high level. The N-channel transistor 27 and the P-channel transistor 28 are connected in parallel between a source that generates bias voltage VBP lower than power supply voltage $V_{DD}$ and the gate of the P-channel transistor 22, an up signal is supplied to the gate of the N-channel transistor 27 and an up* signal is supplied to the gate of the P-channel transistor 28. The P-channel transistor 29 is connected between the power source $V_{DD}$ and the gate of the P-channel transistor 22 and an up signal is supplied to the gate. The N-channel transistor 30 and the P-channel transistor 31 are connected in parallel between a source that generates bias voltage VBN higher than the potential of GND and the gate of the N-channel transistor 23, a down signal is supplied to the gate of the N-channel transistor 30 and a down* signal is supplied to the gate of the P-channel transistor 31. The N-channel transistor 32 is connected between the gate of the N-channel transistor 23 and GND and a down* signal is supplied to the gate.

Figure 2B:
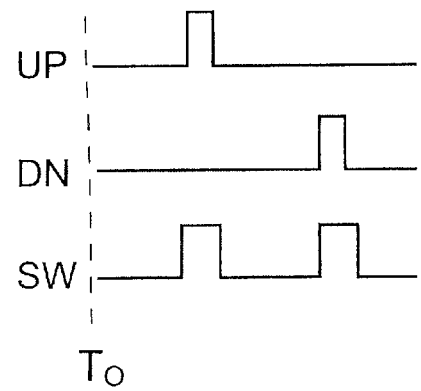
FIG. 2(b) is a timing chart of FIG. 2(a)

Referring to FIGS. 2(a) and 2(b), the operation of the charge pump circuit in this embodiment will be described below.

A switching signal and a switching* signal are generated separately according to the output of a phase-frequency comparator, a switching signal is a signal that is switched to a high level before an up signal and a down signal respectively become a high level as shown in FIG. 2(b) and is switched to a low level after these respectively become a low level and a switching* signal is a signal acquired by inverting a switching signal.

The P-channel transistor 21 is turned on when a switching* signal supplied to the gate is at a low level, connects the power source $V_{DD}$ to the source of the P-channel transistor 22 and is turned off when a switching* signal is at a high level. The P-channel transistor 22 functions as a constant current source by applying bias voltage VBP lower than power supply voltage $V_{DD}$ to the gate via the transfer switch comprising the N-channel transistor 27 and the P-channel transistor 28 in a state in which the source is connected to the power source $V_{DD}$ when an up signal is at a high level, supplies constant current to LPF 105 and is turned off by applying power supply voltage $V_{DD}$ to the gate via the P-channel transistor 29 when an up signal is at a low level.

Also, the N-channel transistor 24 is turned on when a switching signal supplied to the gate is at a high level, connects GND to the source of the N-channel transistor 23 and is turned off when a switching signal is at a low level. The N-channel transistor 23 functions as a constant current source by applying bias voltage VBN higher than the potential of GND to the gate via the transfer switch comprising the N-channel transistor 30 and the P-channel transistor 31 in a state in which the source is connected to GND when a down signal is at a high level, discharges constant current from LPF 105 and is turned off by turning the gate at a GND level via the N-channel transistor 32 when a down* signal is at a high level.

At this time, as the switching element 25 is turned on when a switching signal is at a low level, the connection B of the P-channel transistors 21 and 22 is switched to a potential close to the potential of GND according to the internal resistance of the switching element.

Also, as the switching element 26 is turned on when a switching* signal is at a high level, the connection A of the N-channel transistors 23 and 24 is switched to a potential close to power supply voltage $V_{DD}$ according to the internal resistance of the switching element.

As the switching elements 25 and 26 are turned at a high level before an up signal and a down signal respectively become a high level and are turned at a low level after the signals respectively become a low level as shown in FIG. 2(b), each potential of the connections A and B can be stabilized before the P-channel transistor 22 and the N-channel transistor 23 that respectively function as a constant current source are operated.

As described above, as the switching element 25 is turned on in a state in which the P-channel transistor for switching 21 is turned off, power supply voltage $V_{DD}$ is applied to the back gate of the P-channel transistor 22 that functions as a constant current source, bias is applied to the source by turning the source potential close to that of GND, therefore, as threshold voltage Vth substantially becomes high because of back gate effect and inverse bias is applied between the source and the gate, leakage current is further prevented, compared with the case of the first embodiment.

Similarly, as the switching element 26 is turned on in a state in which the N-channel transistor 24 for switching is turned off, bias is applied to the source of the N-channel transistor 23 that functions as a constant current source by connecting the back gate to GND and turning the potential of the source close to power supply voltage $V_{DD}$, therefore, as threshold voltage Vth substantially becomes high because of back gate effect and inverse bias is applied between the source and the gate, leakage current is further prevented, compared with the case of the first embodiment.

As described above, in the charge pump circuit for charging/discharging LPF that supplies input to VCO via the constant current source transistor when the transistor for switching is turned on of the PLL circuit equivalent to this embodiment, as back gate effect is produced in the constant current source transistor when the transistor for switching is turned off and leakage current is prevented by applying inverse bias, the offset and the jitter of the frequency of an output clock in the PLL circuit can be reduced.

Third Embodiment

Figure 3:
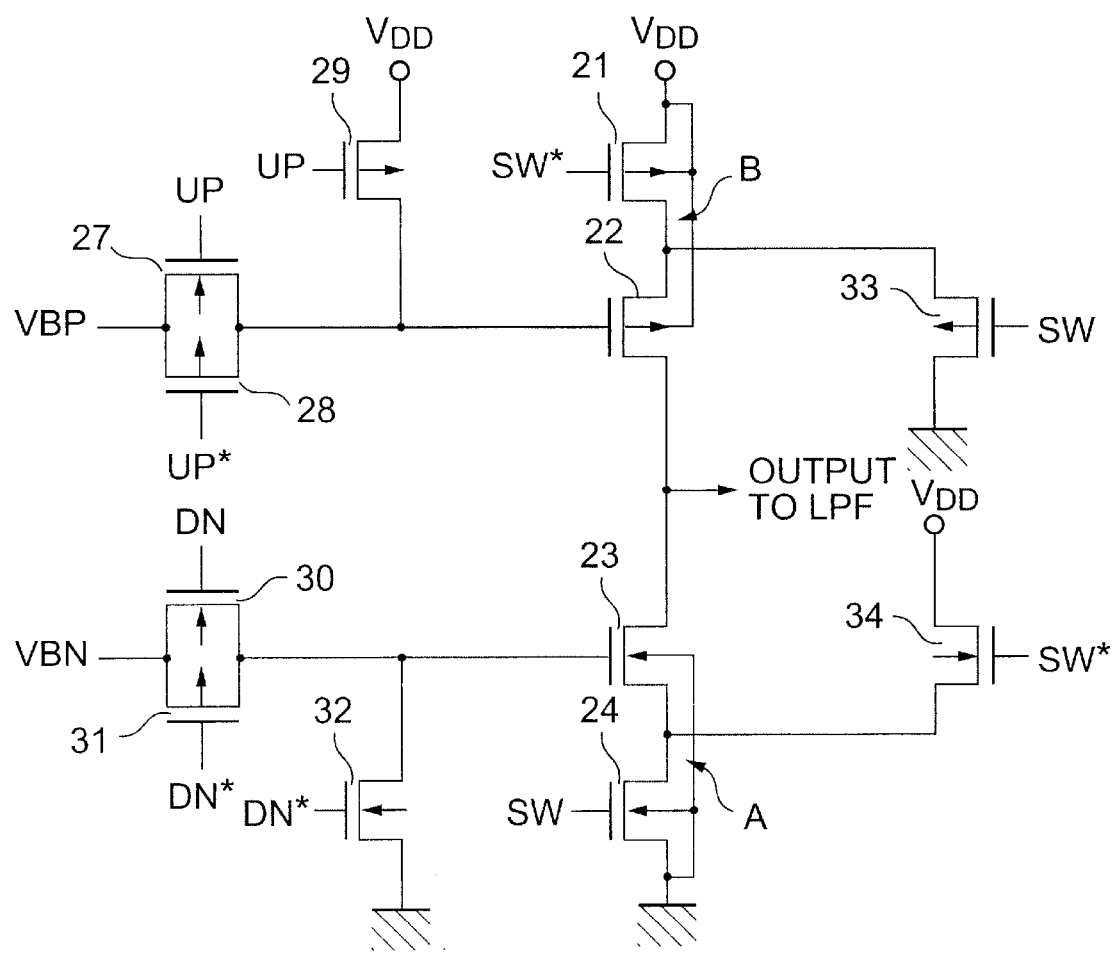
FIG. 3 is a circuit diagram showing a charge pump circuit composing a PLL circuit equivalent to a third embodiment of the invention.

FIG. 3 shows a charge pump circuit of a PLL circuit equivalent to a third embodiment of the invention.

The charge pump circuit in this embodiment is composed of P-channel transistors 21 and 22, N-channel transistors 23 and 24, an N-channel transistor 27, P-channel transistors 28 and 29, an N-channel transistor 30, a P-channel transistor 31, an N-channel transistor 32, a P-channel transistor 33 and an N-channel transistor 34 as shown in FIG. 3.

In this embodiment, the configuration of the P-channel transistors 21 and 22, the N-channel transistors 23 and 24, the N-channel transistor 27, the P-channel transistors 28 and 29, the N-channel transistor 30, the P-channel transistor 31 and the N-channel transistor 32 is similar to that in the second embodiment shown in FIG. 2(a), however, the third embodiment is greatly different from the second embodiment in that the P-channel transistor 33 and the N-channel transistor 34 are provided in place of the switching elements 25 and 26 in the second embodiment.

The P-channel transistor 33 is connected between the connection B of the P-channel transistors 21 and 22 and GND and is turned on when a switching signal is at a low level. The N-channel transistor 34 is connected between the power source $V_{DD}$ and the connection A of the N-channel transistors 23 and 24 and is turned on when a switching* signal is at a high level.

Referring to FIG. 3, the operation of the charge pump circuit in this embodiment will be described below.

In this embodiment, each operation of the P-channel transistors 21 and 22, the Nchannel transistors 23 and 24, the N-channel transistor 27, the P-channel transistors 28 and 29, the N-channel transistor 30, the P-channel transistor 31 and the N-channel transistor 32 is similar to that in the second embodiment shown in FIGS. 2(a) and 2(b).

As the P-channel transistor 33 is turned on when a switching signal is at a low level, the connection B of the P-channel transistors 21 and 22 is switched to a potential close to that of GND according to the internal resistance when the P-channel transistor 33 is turned on. Also, as the N-channel transistor 34 is turned on when a switching* signal is at a high level, the connection A of the N-channel transistors 23 and 24 is switched to a potential close to that of the power source $V_{DD}$ according to the internal resistance when the N-channel transistor 34 is turned on.

Therefore, as the P-channel transistor 33 is turned on in a state in which the P-channel transistor for switching 21 is turned off, bias is applied to the source by applying power supply voltage $V_{DD}$ to the back gate of the P-channel transistor 22 that functions as a constant current source and turning the source potential close to that of GND, therefore, as threshold voltage Vth substantially becomes high because of back gate effect and inverse bias is applied between the source and the gate by turning on the P-channel transistor 29 and applying power supply voltage $V_{DD}$ to the gate, leakage current is further prevented, compared with the case of the first embodiment.

Similarly, as the N-channel transistor 34 is turned on in a state in which the N-channel transistor for switching 24 is turned off, bias is applied to the source by connecting the back gate of the N-channel transistor 23 that functions as a constant current source to GND and turning the source potential close to power supply voltage $V_{DD}$, therefore, as threshold voltage Vth substantially becomes high because of back gate effect and inverse bias is applied between the source and the gate by turning on the N-channel transistor 32 and applying the potential of GND to the gate, leakage current is further prevented, compared with the case of the first embodiment.

As described above, in the charge pump circuit for charging/discharging LPF that supplies input to VCO via the constant current source transistor when the transistor for switching is turned on of the PLL circuit equivalent to this embodiment, as leakage current is prevented by applying such inverse bias as produces back gate effect to the constant current source transistor when the transistor for switching is turned off, the offset and the jitter of the frequency of an output clock in the PLL circuit can be reduced.

Fourth Embodiment

Figure 4:
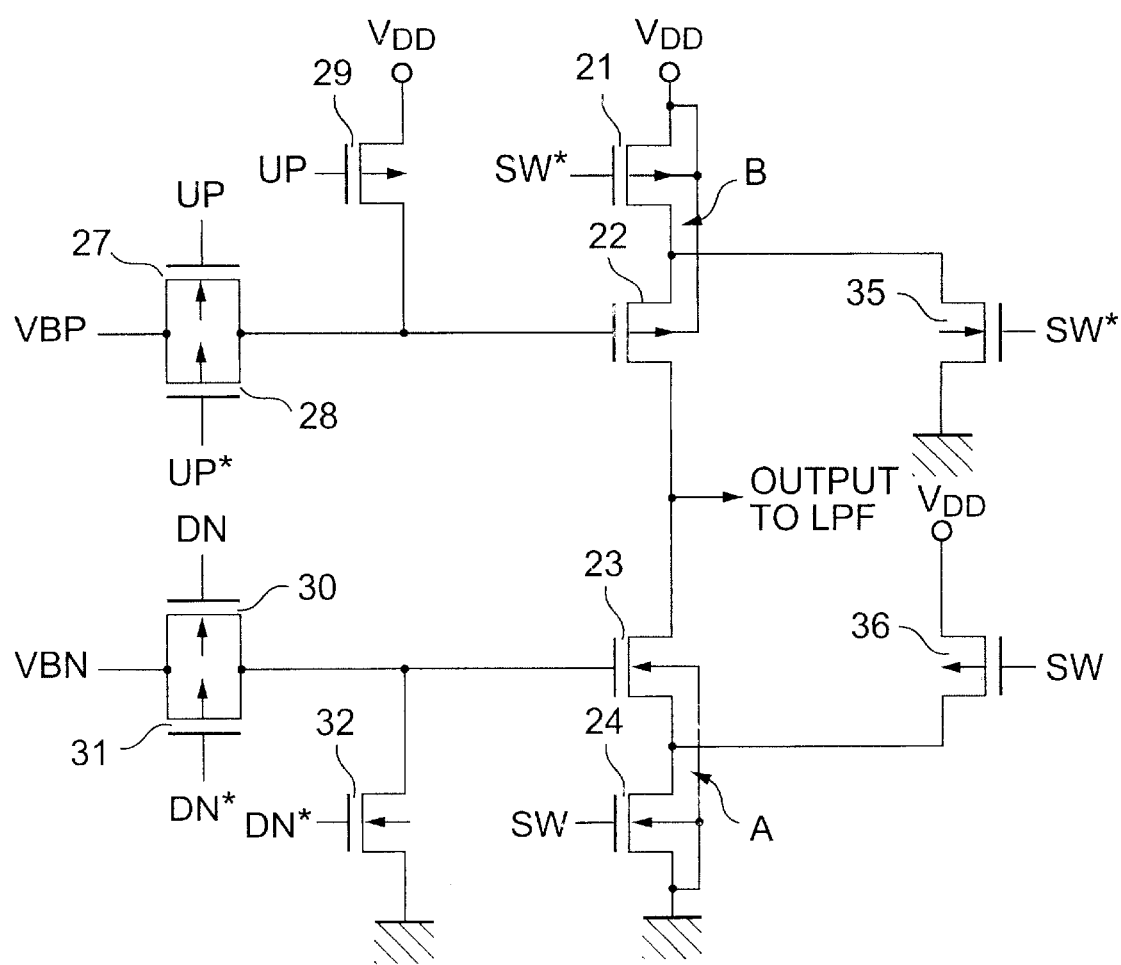
FIG. 4 is a circuit diagram showing a charge pump circuit composing a PLL circuit equivalent to a fourth embodiment of the invention.

FIG. 4 shows a charge pump circuit of a PLL circuit equivalent to a fourth embodiment of the invention.

The charge pump circuit in this embodiment is composed of P-channel transistors 21 and 22, N-channel transistors 23 and 24, an N-channel transistor 27, P-channel transistors 28 and 29, an N-channel transistor 30, a P-channel transistor 31, an N-channel transistor 32, an N-channel transistor 35 and a P-channel transistor 36 as shown in FIG. 4.

In this embodiment, the configuration of the P-channel transistors 21 and 22, the N-channel transistors 23 and 24, the N-channel transistor 27, the P-channel transistors 28 and 29, the N-channel transistor 30, the P-channel transistor 31 and the N-channel transistor 32 is similar to that in the third embodiment shown in FIG. 3, however, the fourth embodiment is greatly different from the third embodiment in that the N-channel transistor 35 and the P-channel transistor 36 are provided in place of the P-channel transistor 33 and the N-channel transistor 34 in the third embodiment. The N-channel transistor 35 is connected between the connection B of the P-channel transistors 21 and 22 and GND and is turned on when a switching* signal is at a high level. The P-channel transistor 36 is connected between the power source $V_{DD}$ and the connection A of the N-channel transistors 23 and 24 and is turned on when a switching signal is at a low level.

Referring to FIG. 4, the operation of the charge pump circuit in this embodiment will be described below.

In this embodiment, the operation of the P-channel transistors 21 and 22, the N-channel transistors 23 and 24, the N-channel transistor 27, the P-channel transistors 28 and 29, the N-channel transistor 30, the P-channel transistor 31 and the N-channel transistor 32 is similar to that in the third embodiment shown in FIG. 3.

As the N-channel transistor 35 is turned on when a switching* signal is at a high level, the connection B of the P-channel transistors 21 and 22 is switched to a potential close to that of GND according to the internal resistance when the N-channel transistor 35 is turned on.

Also, as the P-channel transistor 36 is turned on when a switching signal is at a low level, the connection A of the N-channel transistors 23 and 24 is switched to a potential close to that of the power source $V_{DD}$ according to the internal resistance when the N-channel transistor 36 is turned on.

Therefore, as the N-channel transistor 35 is turned on in a state in which the P-channel transistor for switching 21 is turned off, bias is applied to the source by applying power supply voltage $V_{DD}$ to the back gate of the P-channel transistor 22 that functions as a constant current source and turning the source potential close to that of GND, therefore, as threshold voltage Vth substantially becomes high because of back gate effect and inverse bias is applied between the source and the gate by turning on the P-channel transistor 29 and applying power supply voltage $V_{DD}$ to the gate, leakage current is further prevented, compared with the case of the first embodiment.

Similarly, as the P-channel transistor 36 is turned on in a state in which the N-channel transistor for switching 24 is turned off, bias is applied to the source by connecting the back gate of the N-channel transistor 23 that functions as a constant current source to GND and turning the source potential close to power supply voltage $V_{DD}$, therefore, as threshold voltage Vth substantially becomes high because of back gate effect and inverse bias is applied between the source and the gate by turning on the N-channel transistor 32 and applying the potential of GND to the gate, leakage current is further prevented, compared with the case of the first embodiment.

As described above, in the charge pump circuit for charging/discharging LPF that supplies input to VCO via the constant current source transistor when the transistor for switching is turned on of the PLL circuit equivalent to this embodiment, as leakage current is prevented by applying such inverse bias as produces back gate effect to the constant current source transistor when the transistor for switching is turned off, the offset and the jitter of the frequency of an output clock in the PLL circuit can be reduced.

Fifth Embodiment

Figure 5:
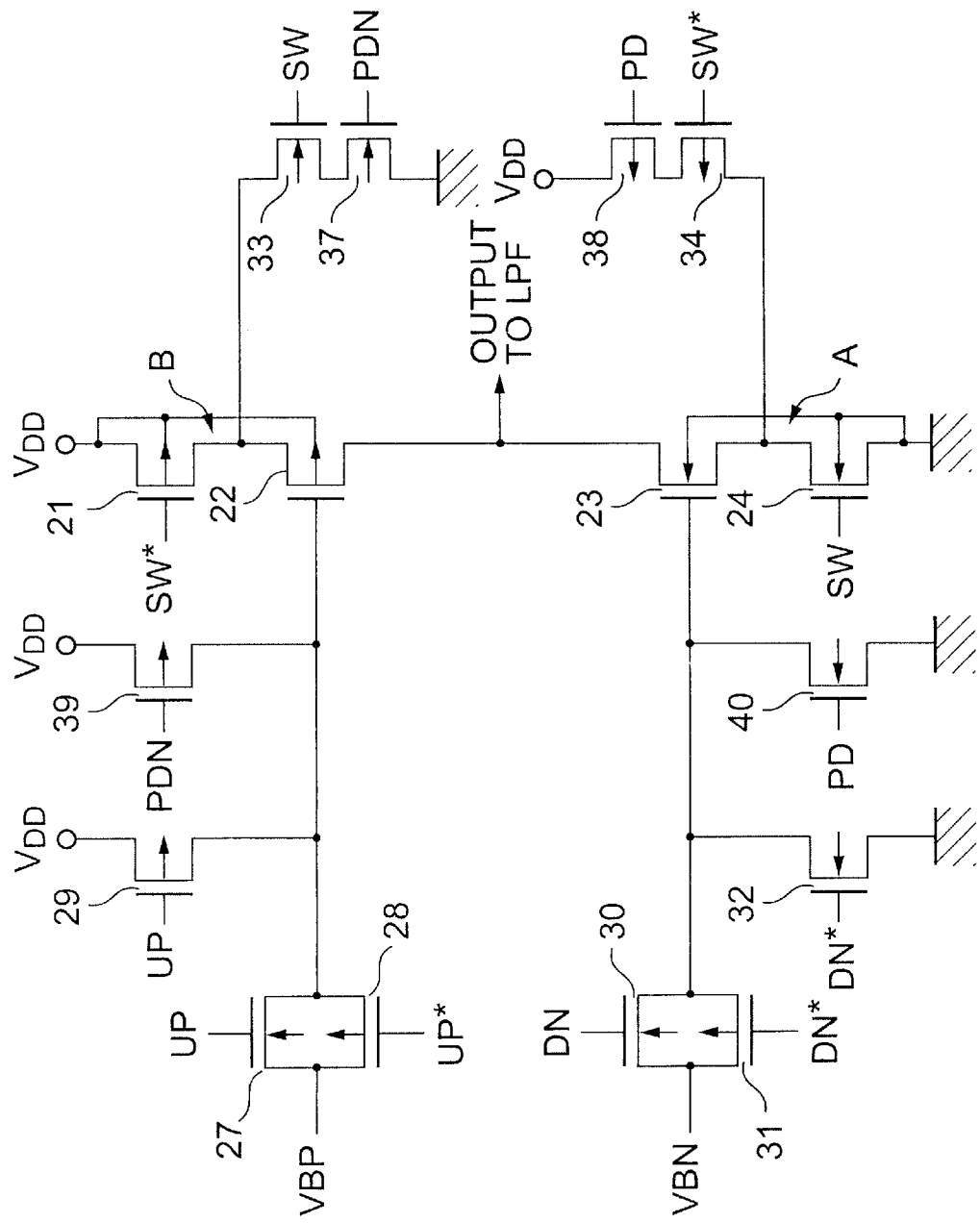
FIG. 5 is a circuit diagram showing a charge pump circuit composing a PLL circuit equivalent to a fifth embodiment of the invention.

FIG. 5 shows a charge pump circuit of a PLL circuit equivalent to a fifth embodiment of the invention.

The charge pump circuit in this embodiment is composed of P-channel transistors 21 and 22, N-channel transistors 23 and 24, an N-channel transistor 27, P-channel transistors 28 and 29, an N-channel transistor 30, a P-channel transistor 31, an N-channel transistor 32, an P-channel transistor 33, an N-channel transistor 34, an N-channel transistor 37, a P-channel transistor 38, a P-channel transistor 39 and an N-channel transistor 40 as shown in FIG. 5.

In this embodiment, the configuration of the P-channel transistors 21 and 22, the N-channel transistors 23 and 24, the N-channel transistor 27, the P-channel transistors 28 and 29, the N-channel transistor 30, the P-channel transistor 31, the N-channel transistor 32, the P-channel transistor 33 and the N-channel transistor 34 is similar to that in the third embodiment shown in FIG. 3, however, the fifth embodiment is greatly different from the third embodiment in th at the N-channel transistor 37, the P-channel transistors 38 and 39 and the N-channel transistor 40 are further provided.

The N-channel transistor 37 is connected between the P-channel transistor 33 and GND and a power down* (PDN) signal is supplied to the gate. The P-channel transistor 38 is connected between the power source $V_{DD}$ and the N-channel transistor 34 and a power down (PD) signal is supplied to the gate. The P-channel transistor 39 is connected between the power source $V_{DD}$ and the gate of the P-channel transistor 22 and a power down* (PDN) signal is supplied to the gate. The N-channel transistor 40 is connected between the gate of the N-channel transistor 23 and GND and a power down (PD) signal is supplied to the gate.

Referring to FIG. 5, the operation of the charge pump circuit in this embodiment will be described below.

In this embodiment, the operation of the P-channel transistors 21 and 22, the N-channel transistors 23 and 24, the N-channel transistor 27, the P-channel transistors 28 and 29, the N-channel transistor 30, the P-channel transistor 31, the N-channel transistor 32, the P-channel transistor 33 and the N-channel transistor 34 is similar to that in the third embodiment shown in FIG. 3.

When the power of a device including the PLL circuit lowers, the oscillation of the PLL circuit stops and the charge of LPF that supplies input to VCO becomes zero. In this state, no up signal, no down signal and no switching signal are generated, however, a power down (PD) signal and a power down* (PDN) signal acquired by inverting the PD signal respectively for instructing power down are supplied to each part.

At this time, the N-channel transistor 37 is turned off when a PDN signal becomes a low level and the P-channel transistor 38 is turned off when a PD signal becomes a high level. Simultaneously, the P-channel transistor 39 is turned on when a PDN signal becomes a low level and applies power supply voltage $V_{DD}$ to the gate of the P-channel transistor 22. The N-channel transistor 40 is turned on when a PD signal becomes a high level and grounds the gate of the N-channel transistor 23.

Hereby, as the P-channel transistor 22 and the N-channel transistor 23 that respectively function as a constant current source are both kept at a state in which leakage current is minimum and a current path from the power source $V_{DD}$ to GND via the P-channel transistors 21 and 33 and a current path from the power source $V_{DD}$ to GND via the N-channel transistors 34 and 24 are both cut off, the charge pump circuit is kept at a state in which consumed current is minimum.

As described above, in the charge pump circuit for charging/discharging LPF that supplies input to VCO via the constant current source transistor when the transistor for switching is turned on of the PLL circuit equivalent to this embodiment, as leakage current is prevented by applying such inverse bias as produces back gate effect to the constant current source transistor when the transistor for switching is turned off, the offset and the jitter of the frequency of an output clock in the PLL circuit can be reduced and further, current consumed by the charge pump circuit in a state in which the power lowers can be minimized.

As described above, referring to the drawings, the embodiments of the invention are described in detail, however, the concrete configuration is not limited to the configuration in the embodiments and the change of design in a range which does not deviate from the object of the invention is included in the invention. For example, relationship between the charging and the discharge of the constant current source according to an up signal and a down signal also may be reversed dependent upon the configuration of VCO. The switching elements 15 and 16 also may be composed of a P-channel transistor or an N-channel transistor or may be also composed of a transfer switch. Also, the P-channel transistors 11, 21, 29, 33, 36, 38 and 39 and the N-channel transistors 14, 24, 32, 34, 35, 37 and 40 also may be composed of a transfer switch.

As described above, according to the PLL circuit according to the present invention, the offset and the jitter of the frequency of an output clock caused by leakage current from the constant current source transistor in the charge pump circuit for generating input to VCO according to a signal based upon the result of comparing the phase of a clock output from VCO with that of a reference clock can be prevented.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A charge pump circuit comprising:
   a first current source transistor;
   a first switching circuit for receiving a first control signal and electrically connecting a source electrode of said first current source transistor to a first voltage source for supplying a charge current from said first voltage source to an output terminal when said first control signal is in an active level, and for electrically connecting said source electrode of said first current source transistor to a second voltage source for cutting off said charge current when said first control signal is in an inactive level;
   a second current source transistor; and
   a second switching circuit for receiving a second control signal and electrically connecting a source electrode of said second current source transistor to a third voltage source for discharging a discharge current from said output terminal to said third voltage source when said second control signal is in an active level, and for electrically connecting said source electrode of said second current source transistor to a fourth voltage source for cutting off said second current source transistor when said second control signal is in an inactive level.

2. The charge pump circuit as claimed in claim 1, wherein said second voltage source provides said source electrode of said first current source transistor with cut off bias against a gate voltage of said first current source transistor when said first control signal is in said inactive level; and
   wherein said fourth voltage source provides said source electrode of said second current source transistor with cut off bias against a gate voltage of said second current source transistor when said second control signal is in said inactive level.

3. The charge pump circuit as claimed in claim 1, wherein said first voltage source provides a substantially equal voltage to said fourth voltage source; and
   wherein said second voltage source provides substantially equal voltage to said third voltage source.

4. The charge pump circuit as claimed in claim 1, wherein said first current source transistor comprises a P-channel MOS transistor, and said second current source transistor comprises an N-channel MOS transistor.

5. The charge pump circuit as claimed in claim 1, wherein said first switching circuit comprises a P-channel MOS transistor coupled between said first voltage source and said source electrode of said first current source transistor for receiving said first control signal to a gate electrode of said P-channel MOS transistor, and a first MOS transistor coupled between said second voltage source and said source electrode of said first current source transistor and turned on when said first control signal is in a high level; and
   wherein said second switching circuit comprises an N-channel MOS transistor coupled between said third voltage source and said source electrode of said second current source transistor for receiving said second control signal to a gate electrode of said N-channel MOS transistor, and a second MOS transistor coupled between said fourth voltage source and said source electrode of said second current source transistor and turned on when said second control signal is in a low level.

6. The charge pump circuit as claimed in claim 1, wherein said charge pump circuit is used for a phase locked loop circuit comprising a phase comparator, a low pass filter and a voltage controlled oscillator; and
   wherein said first control signal and said second control signal are control signals based on outputs of said phase comparator; and
   wherein said output terminal is connected to an input terminal of said low pass filter.

7. The charge pump circuit as claimed in claim 1, wherein a gate electrode of said first current source transistor is connected to a first fixed bias voltage; and
   wherein a gate electrode of said second current source transistor is connected to a second fixed bias voltage.

8. The charge pump circuit as claimed in claim 1, wherein a back gate of said first current source transistor is provided with a fixed bias voltage substantially equal to said first voltage source; and
   wherein a back gate of said second current source transistor is provided with a fixed bias voltage substantially equal to said third voltage source.

9. The charge pump circuit as claimed in claim 1, and further comprising:
   a third switching circuit connecting a gate electrode of said first current source transistor with said first voltage source or a first bias voltage based on a third control signal; and
   a fourth switching circuit connecting a gate electrode of said second current source transistor with said third voltage source or a second bias voltage based on a fourth control signal.

10. The charge pump circuit as claimed in claim 1, wherein said charge pump circuit is controlled by a power down signal; and
    wherein said first switching circuit does not electrically connect said source electrode of said first current source transistor to said second voltage source regardless of said first control signal, a gate electrode of said first current source transistor is connected to said first voltage source, said second switching circuit does not electrically connect said source electrode of said second current source transistor to said fourth voltage source regardless of said second control signal, and a gate electrode of said second current source transistor is connected to said third voltage source, when said power down signal is active.

* * * * *